United States Patent
Baker et al.

[11] Patent Number: 5,999,414
[45] Date of Patent: Dec. 7, 1999

[54] PHYSICALLY SEPARATING PRINTED CIRCUIT BOARDS WITH A RESILIENT, CONDUCTIVE CONTACT

[75] Inventors: John D. Baker, La Cañada; Alberto Montalvo, Sierra Madre, both of Calif.

[73] Assignee: California Institute of Technology, Pasadena, Calif.

[21] Appl. No.: 08/818,167

[22] Filed: Mar. 14, 1997

[51] Int. Cl.[6] .............................. H05K 1/14; H05K 1/11; H01R 23/68; H01R 23/72
[52] U.S. Cl. .......................... 361/789; 361/744; 361/790; 361/803; 439/66; 439/591
[58] Field of Search .......................... 174/138 G, 138 D; 257/686, 723, 724; 361/744, 785, 784, 789, 790, 803, 804; 439/66, 67, 77, 197, 493, 591, 74, 886

[56] References Cited

U.S. PATENT DOCUMENTS

| 3,851,297 | 11/1974 | Munro | 439/66 |
| 3,904,934 | 9/1975 | Martin | 361/803 |
| 5,102,343 | 4/1992 | Knoight et al. | 439/67 |
| 5,230,632 | 7/1993 | Baumberger et al. | 439/66 |
| 5,617,866 | 4/1997 | Marian, Jr. | 439/66 |

Primary Examiner—Donald Sparks
Attorney, Agent, or Firm—Fish & Richardson P.C.

[57] ABSTRACT

A multi-board module provides high density electronic packaging in which multiple printed circuit boards are stacked. Electrical power, or signals, are conducted between the boards through a resilient contact. One end of the contact is located at a via in the lower circuit board and soldered to a pad near the via. The top surface of the contact rests against a via of the facing printed circuit board.

11 Claims, 3 Drawing Sheets

PHYSICALLY SEPARATING PRINTED CIRCUIT BOARDS WITH A RESILIENT, CONDUCTIVE CONTACT

ORIGIN OF INVENTION

The invention described herein was made in the performance of work under a NASA contract, and is subject to the provisions of Public Law 96-517 (35 U.S.C. 202) in which the Contractor has elected to retain title.

FIELD OF THE INVENTION

The present invention relates to electrical interconnections between circuit boards. More specifically, the invention defines a connector which provides electrical connection and physical spacing between two circuit boards.

BACKGROUND AND SUMMARY

Minimizing overall package size is a key design consideration for electronics packaging. Integrated circuit technology has made impressive advances toward reducing the size of the on-chip circuits required for a given processing task. Associated electronics packaging has not kept pace with this rapid miniaturization. Advanced integrated circuit packages, including flatpack and surface mount devices, are known. However, printed circuit boards which hold the integrated circuits and other electronics components can significantly increase overall electronics package size. Even more space is used between boards when multiple circuit boards are arranged in a stack.

Current interconnect technology requires the circuit boards to be spaced relatively far apart. This space is needed, in part, to provide the electrical interconnections required between the two circuit boards. Electronic devices having several stacked printed circuit boards hence includes a large amount of empty space. This situation has stymied efforts to miniaturize a wide variety of electronic devices.

These space constraints are particularly acute in the aerospace industry. Size and weight restrictions sometimes allow very little space for avionics and other on-board electronic equipment.

In view of these problems, the inventors have recognized a strong need for an improved circuit board interconnection technique. The present inventors also recognize a need for interconnecting circuit boards in a closer spaced relationship.

One traditional way to interconnect multiple circuit boards is via the edge connector. In this approach, one edge of the circuit board is configured with a number of conductive pads. These pads are then plugged into a mating socket. Edge connectors provide mechanical mounting as well as electrical connection between adjacent circuit boards, or between circuit boards and other devices.

One problem with edge connectors is that they position circuit boards relatively wide apart. This is because the mounting sockets must be large and strong enough to support the weight of the board as well as provide electrical connections. The result is more wasted space and added weight.

The inventors have also recognized that these edge connectors require relatively long conductive paths. These paths must lead from components that are spaced throughout the board, to the edge of the board where the connector is located. The path then continues through cables from connector to connector. Longer signal paths decrease circuit speed and increase unwanted capacitance and susceptibility to electromagnetic interference. Poor conductivity can also be a problem with some of these connectors.

Other approaches, called three dimensional interconnect schemes, connect the boards in a more direct manner. One of these uses straight copper posts which extend through holes in the circuit boards. Metal spacers surrounding the posts maintain the boards in a predetermined spaced relationship. Reflow solder techniques electrically connect the copper posts in the plated-through holes.

When copper posts are used, the boards must be removed to make repairs. This requires the removal of all of the solder joints between the copper posts and the printed circuit boards. This is often a very time consuming and expensive procedure. Tight manufacturing tolerances are required in order to avoid misalignment of the plated-through holes in the boards which receive the copper posts. Also, precise board spacing can be difficult to maintain using copper posts.

Another approach to connecting printed circuit boards is the use of elastomeric connectors. These connectors are nonconductive resilient members with conductive strips applied to both sides. Elastomeric connectors are usually sandwiched between two circuit boards providing electrical contact and physical spacing therebetween. Because elastomeric connectors are not positively connected to the printed circuit board, they may easily become misaligned. Also, since only a small amount of metal can be deposited on the elastomeric member, they have correspondingly low current carrying capacity.

In view of the above, it is an object of the present invention to overcome these disadvantages, and to provide a connector which allows an improved interconnection of multiple printed circuit with minimal signal path length. It is also an object of the present invention to provide a printed circuit board connection that is self aligning and that allows the system to be easily assembled and reassembled for servicing.

Specifically, the present invention defines a printed circuit board interconnect assembly that has the following components. A plurality of circuit boards are configured so that conductive areas on facing board surfaces are disposed adjacent to each other where it is desired to electrically connect the boards to each other. A contact is placed between the two circuit boards in electrical contact with the two adjacent conductive areas. The contact provides electrical connection between the two conductive areas. The boards are then fastened or compressed together by fasteners. This compresses the contact and improves electrical contact between the contact and the boards.

In one embodiment, the contact includes a curved laminar member having first and second surfaces, each in physical contact with one of the adjacent conductive areas. A resilient substance, such as an elastomeric material, is disposed between the first and second surfaces. The contact is used to maintain a predetermined spatial relationship between the boards. The first surface of the laminar member is physically coupled to the first printed circuit board area so as to physically restrict lateral motion therebetween.

The inventors have recognized that a resilient contact of this sort can be directly compressed between conductive pads on adjacent circuit boards. Proper placement of the pads can minimize signal path length as compared to conventional edge connectors. The result is shorter path length and faster circuit operation as compared to edge connectors. Furthermore, the present invention permits the boards to be stacked closer to each other than prior techniques. The spacing is limited only by the height of the components on the board. This significantly reduces the overall size of the electronic package.

BRIEF DESCRIPTION OF THE DRAWINGS

These and other aspects will be described with reference to the accompanying drawings wherein:

FIGS. 7A, 7B, 7C, 7D, 7E and 7F show various embodiments of the circuit board contact of the present invention.

DESCRIPTION OF THE PREFERRED EMBODIMENTS

A presently preferred embodiment of the multi-board high density electronic packaging module is set forth herein with reference to the accompanying drawings. The multi-board module interconnects multiple printed circuit boards with a resilient connector disposed between adjacent vias on the boards. Unlike conventional circuit board connectors, the invention requires no edge connectors, plugs, or soldered-in posts. The multi-board module of the invention minimizes the spacing between boards. Also, signal path lengths are minimized since the signal can pass directly between boards from via to via. Vias are conductive openings in the circuit board used to provide electrical connections from one side of a board to another. In the present invention, vias are also used to provide electrical connections between adjacent boards. Path lengths can be minimized further by designing the component and via locations so as to reduce these distances.

Figure 1:
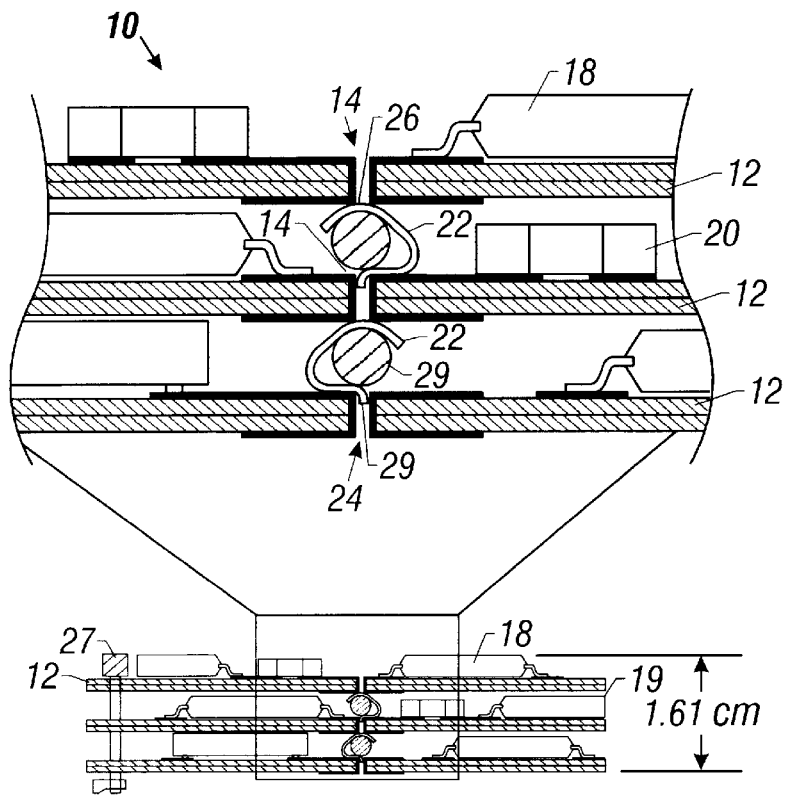
FIG. 1 shows a diagram of a multi-board module of the present invention.

FIG. 1 shows a multi-board module utilizing standard flatpack integrated circuits. The total size of a three board multi-board module 10 in this example of the present invention is about 1.61 centimeters. This height is limited by the height of the circuit board components, since the connector of the present invention can be scaled down to provide even smaller spaces between circuit boards. Each circuit board 12 is a conventional printed circuit board having conventional surface mount integrated circuits, such as flatpack ICs 18, chip resistors 20, and other components mounted thereon.

Conventional vias 14 are designed into the circuit boards 12. Vias 14 in two circuit boards 12 are connected electrically by contacts 22. The contacts 22 include a resilient spacing structure between adjacent circuit boards 12. In the preferred embodiment, this resilient spacing structure is embodied by an elastomeric insert 29 included in the contact. Resilient spacing between boards provides resistance against excessive shock and vibrations resulting in a more rugged module. The contacts 22 also include a protruding end 24 at the bottom of the contact, which is a device to align adjacent circuit boards 12, and a curved top section 26.

A plurality of fasteners 27 hold the printed circuit boards 12 securely together. Fastener 27, may comprise, for example, a threaded bolt and nut. When tightened, the fasteners 27 apply sufficient force between via 14 and contact 22 to provide adequate electrical and physical connection. This force is an amount which preferably slightly compresses the elastomeric insert 29 within the contact 22. The pressure helps ensure a good electrical contact with the vias and prevents migration or misalignment resulting from shock and vibration. The boards should be compressed by a limited amount to avoid contact between integrated circuits 18 and the adjacent printed circuit boards 12.

Contacts 22 shown in FIG. 1 are preferably arranged to have alternating orientations. The opening on the upper contact 22 between upper curved surface 44 and lower flat surface 40 is on the left. The contact below the opening is on the right. The alternating orientation is used in order to avoid an accumulated torque force from all spring forces being in the same direction.

Standard flatpack ICs 18 have a small height. The height of the tallest device on a circuit board determines the minimum distance between two boards. If the ICs and other components are flatter, the boards could be closer. The contact 22 of the present invention can be scaled down to be considerably smaller than the flatpack IC height. Also, the contacts may be sized to permit the top of the tallest IC to touch the bottom of the circuit board above. This may be desirable because of the resultant conduction of heat from the IC to the board. This will help facilitate cooling of the IC. Further, a thin film of bonding material 19 may be used to facilitate transfer of heat from the IC.

FIG. 1 shows three circuit boards mounted using the contacts 22. The total height of the three board module of only about 1.61 centimeters.

Figure 2:
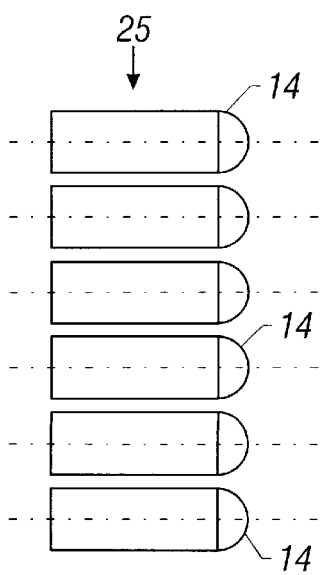
FIG. 2 shows a diagram of a typical printed wiring board via pad layout.

FIG. 2 shows a portion of the printed circuit board 12 pad layout. A series of vias 14 are shown. Each via is in electrical contact with a via pad 32. The contact 22 is soldered to a lower via 14 (as shown in FIG. 1) and is in compressive contact with an upper via 14.

Figure 3A:
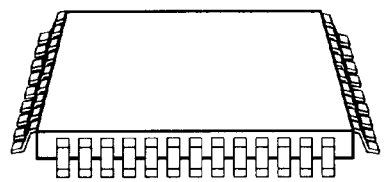
FIGS. 3A and 3B show perspective and cross-sectional views of a circuit board assembly of the present invention using thin flatpack.
Figure 3B:
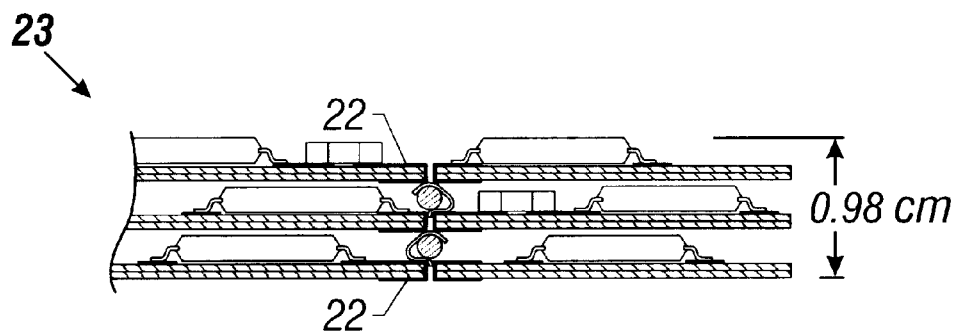

FIG. 3A shows a type of integrated circuit package referred to as a Thin Flatpack. The three board module 23 in FIG. 3B uses contacts 22 which are scaled down to provide a spacing height of just slightly greater than the height of the thin flatpack. The three board module 23 has a total height of only 0.98 centimeters.

Figure 5:
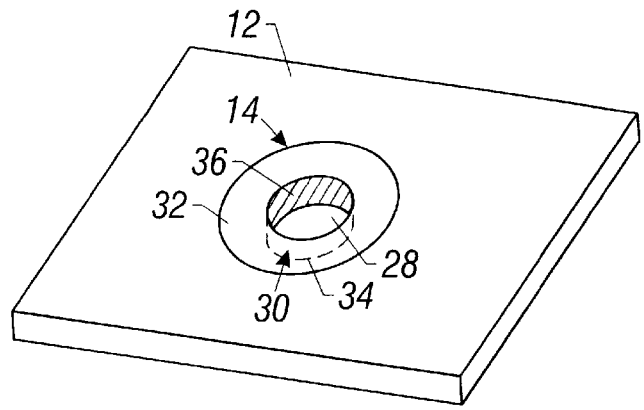
FIG. 5 shows a perspective view of a printed circuit board via.

A via 14 is shown in more detail in FIG. 5. Each via 14 includes a circular opening 28. A pad 30, comprising a conductive material such as solder, surrounds the opening 28. The pad 30 includes an upper annular area 32 on the top of the circuit board 12, a lower annular area 34 on the bottom of the circuit board, and an inner surface 36 in the via opening 28. The via is created in a conventional manner which is well known in the field of printed circuit boards. Vias have been used in conventional printed circuit boards, however, as a way to provide a connection from one side of a board to the other. The vias in this embodiment are used in conjunction with the contact 22 to provide both an electrical connection and a resilient physical separation between the printed circuit boards.

Figure 4:
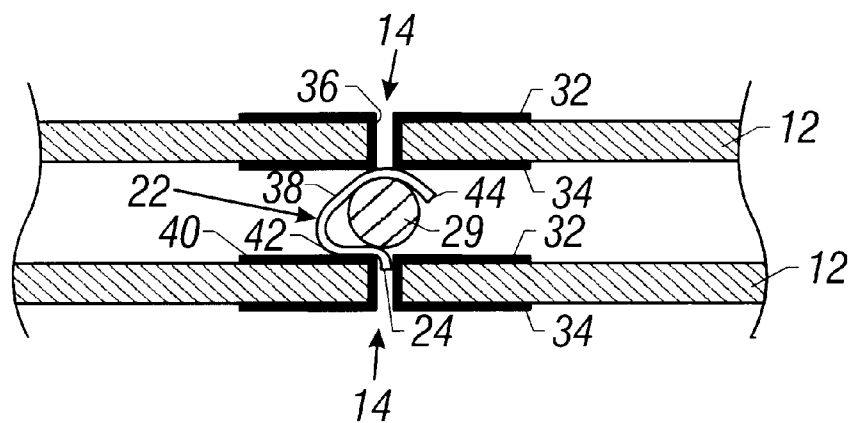
FIG. 4 shows details of the contact of the invention disposed between two printed circuit board vias.
Figure 6:
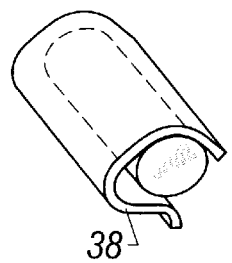
FIG. 6 shows a perspective view of the printed circuit board contact of the present invention.

FIGS. 4 and 6 show the laminar metallic spring-like contact body 38 of contact 22. FIG. 4 is a cross-section of contact body 38, showing a substantially flat bottom surface 40, a curved side surface 42, and a curved top surface 44. The bottom surface 40 includes a protruding end 24 extending into the lower via opening 28. The contact body 38 is preferably made of a sheet of beryllium-copper which is gold plated to ensure a reliable electrical contact. The preferred embodiment fabricates the contact body 38 by bending a sheet of 10 mil thick beryllium-copper metal.

The contact body 38 can be manufactured in production quantities, by using well known precision stamping and bending techniques. The contact body 38 may then be sliced at 20 mil intervals using an EDM machine. The contact body 38 is then preferably tempered to about 600° F. for about three hours to maintain contact stiffness.

An insert 29, made of a resilient substance, is inserted into the space between the curved top surface 44 and the flat bottom surface 40. In the preferred embodiment, the insert is made of an elastomeric material such as silicon rubber. The insert 29 provides a vertical support for the contact 22 and prevents it from collapsing when the two boards 12 are pressed together by the fasteners 27. The insert 44 also provides a cushioned mounting between the two circuit boards. This is more desirable than rigid contacts which put more stress on the boards and connections in the presence of vibration and shock. The contact 22 in FIG. 4 maintains a distance between two printed circuit boards 12 in the range of about 0.1 and 0.125 inches.

As discussed above, prior circuit board connectors utilizing copper posts have been difficult to align. The inventors have discovered that the special surfaces of the multi-board module 10 of the present invention allow it to operate in a self-aligning manner. Orientation surfaces mates with a curved guide surface on the contact to hold the contact in the correct position. During assembly, the protruding contact end 24 ensures that the contact is in the correct position with respect to the orientation surface, here the hole 14 in lower printed circuit board. The top surface 44 self-aligns the contact within a hole 28 that forms the orientation surface by contacting with inner surfaces of via 14. Even more certain alignment characteristics are possible if the contact 22 is configured with a second protruding member 46 that fits into the upper via, as shown in FIG. 7F.

Alignment is important because if a board or a via were misaligned, a good contact might not be made between contact 22 and the via pad 30. Vias on printed circuit boards can typically be located to within a range of plus or minus 0.002 inches.

The primary constraint on the overall size of the multi-board module 10 is the device package height. Industry trends are moving toward smaller and smaller integrated circuit packages. The contact 22 of the present invention can be scaled down to accommodate future lower profile packages or to accommodate different power density requirements. Using thin quad flat pack technology, the present invention can be utilized to create PCMCIA cards which are 0.5 centimeters (3/16") high.

Standard software design tools can be used for the design of circuit boards implementing the present invention. A signal can be specified to a terminal connector contact and each board can be designed as an individual board with vias and holes located in optimum positions to minimize signal path from board to board. In contrast, with edge connectors, each board-to-board signal must travel a relatively long path regardless of its location on the board.

When installing the contacts 22 into the multi-board module 10, the contacts are be placed first on the lower board either manually or automatically. Once integration and test is complete, the contacts 22 may be permanently attached to the board by soldering the lower flat bottom surface 40 to the conductive pad 32. Preferably, the contact 22 is not soldered directly into the via. If it is, the solder is prone to cracking when subjected to temperature extremes. The upper surface 44 is preferably not soldered to permit the layered boards to be easily disassembled and reassembled. This may be required during testing of the boards. Also, leaving the upper surface 44 unsoldered allows individual contacts to be turned off by inserting insulating tabs. This facilitates testing because components can be isolated and tested individually. Testing is also facilitated with the invention because signals can be probed by inserting thin conductive pads in series with the contact and the board.

In some situations, extra thermal heat sinks may be desired because of the close proximity of the boards to each other. This can be accomplished by adding conventional thermal straps to the boards.

Figure 7A:

FIGS. 7A–F show various shapes of the contact 22 of the present invention. FIGS. 7A, C and D show the contact body being configured in different shapes with the same elastomeric insert 29 as in FIG. 1. Various materials may be used for the elastomeric insert such as silicon rubber. A pair of contacts may be mounted adjacent to each other, one for a signal and one for the signal return. In this case a single insert may be used for both contacts.

Figure 7B:
Figure 7C:
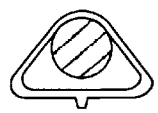
Figure 7A:
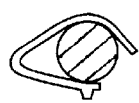
Figure 7B:
Figure 7C:
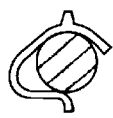

Alternatively, the contact may be configured with no elastomeric insert as long as the contact body can withstand compression without collapsing. For example, FIG. 7B shows a cylindrical shaped contact is used with protruding restraining member at the bottom. In this configuration, no elastomeric insert is used; air fills the space within the cylindrical shaped contact. FIG. 7E shows a solid contact which is made of a conductive material.

FIG. 7F shows a contact having a protruding tip at both the top and bottom to provide easier and more accurate alignment. In general, in the various configurations of FIGS. 7A–F, it is important that the contact have sufficient resilience and stiffness so that adequate electrical contact is maintained by compressing without collapsing the contact.

The present invention provides a cost effective, high density packaging technique. It permits condensing of multiple circuit boards in very close proximity. The contacts 22 can handle enough current so that they can be used to conduct electrical power, as well as signals, between two boards. The contacts 22 are low in cost, easy to install, and permit easy assembly and disassembly of the boards. The present invention provides an inexpensive way to interconnect circuit boards such that the spacing between boards is limited only by the height of the devices on the board. Also, the present invention permits the minimizing of signal path length by locating the vias and connectors at any desirable place in the multi-board module. This will allow higher operating speeds. Also, the present invention eliminates the need for edge connectors and associated cabling.

Although only a few embodiments have been described in detail above, those having ordinary skill in the art will certainly understand that many modifications are possible without departing from the teachings thereof. For example, the contact 22 can be produced with the contact body 38 and resilient insert 36 made of many different materials and in many different shapes. Also, the size of the contact can be varied, even within a single multi-board module, to accommodate different power requirements.

All such modifications are intended to be encompassed within the following claims.

What is claimed is:

1. A circuit board assembly comprising:
   at least first and second circuit boards in spaced relationship, said first and second circuit boards including electrically conductive areas facing each other;
   a contact disposed between said first and second circuit boards, and providing electrical contact between a first electrically conductive area of said first circuit board and a second electrically conductive area of said second circuit board, said contact including a curved member having first and second surfaces, said first surface in physical contact with said first electrically conductive area, and said second surface in contact with said second electrically conductive area; and a resilient substance substantially occupying an area of the contact between the first and second surfaces;

wherein said first circuit board conductive area contains an opening in its surface and wherein said first surface member protrudes into the opening.

2. The printed circuit board assembly according to claim 1, wherein said first surface includes a member engaged with the first printed circuit board conductive area restricting lateral motion therebetween.

3. The circuit board assembly according to claim 1, wherein said first surface is soldered to said conductive area of the first circuit board.

4. The circuit board assembly according to claim 1, wherein said resilient substance is an elastomeric member.

5. The circuit board assembly according to claim 1, wherein said resilient substance comprises a cylindrically-shaped member.

6. The circuit board assembly according to claim 1 wherein the opening is a via.

7. The circuit board assembly according to claim 1 wherein said second circuit board contains an opening in its surface and said second surface has a curved outer surface extending across said second circuit board opening.

8. The circuit board assembly of claim 1, wherein at least one of the surfaces is substantially flat to create extensive contact with the circuit board.

9. A circuit board assembly comprising:

at least first and second circuit boards in spaced relationship, said first and second circuit boards including electrically conductive areas facing each other;

a contact disposed between said first and second circuit boards, and providing electrical contact between a first electrically conductive area of said first circuit board and a second electrically conductive area of said second circuit board, said contact including a curved member having first and second surfaces, said first surface in physical contact with said first electrically conductive area, and said second surface in contact with said second electrically conductive area; and a resilient substance substantially occupying an area of the contact between the first and second surfaces;

wherein said resilient substance comprises a cylindrically shaped member, and wherein said second surface is curved, said first surface is flat, and the laminar member includes an opening disposed between said first and second surfaces, wherein the cylindrical shaped member is inserted into the opening and restrained between the first and second surfaces.

10. A circuit board assembly comprising:

first and second circuit boards in spaced relationship, said first and second circuit boards including electrically conductive areas facing each other, a first electrically conductive area including first recessed surface, and a second electrically conductive area including second recessed surface;

an electrical contact disposed between said first and second circuit boards, including a resilient member, said electrical contact having top and bottom surfaces, the top surface having a curved outer surface which is held by said first recessed surface, and the bottom surface having an outer surface which is held by said second recessed surface.

11. A circuit board assembly according to claim 10, further comprising a film disposed between and in contact on one side with an electrical component on one of the circuit boards, and on another side in contact with the bottom surfaces of the other circuit board, whereby heat is conducted from the electrical component to the second circuit board.

* * * * *